United States Patent
Liao et al.

(10) Patent No.: US 6,805,562 B2
(45) Date of Patent: Oct. 19, 2004

(54) TOOL FOR ATTACHING INTEGRATED CIRCUIT PACKAGE TO ELECTRICAL CONNECTOR

(75) Inventors: Fang-Jwu Liao, Tu-Chen (TW); Chao-Chung Cheng, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/671,114

(22) Filed: Sep. 24, 2003

(65) Prior Publication Data

US 2004/0185687 A1 Sep. 23, 2004

(30) Foreign Application Priority Data

Mar. 19, 2003 (TW) ..................................... 92204268 U

(51) Int. Cl.[7] .............................................. H01R 12/00
(52) U.S. Cl. ........................................ 439/68; 439/330
(58) Field of Search .............................. 439/68, 70, 72, 439/330, 329, 331; 29/740, 741, 830

(56) References Cited

U.S. PATENT DOCUMENTS

| | | | | |
|---|---|---|---|---|
| 4,033,032 A | * | 7/1977 | Romania et al. ............... | 29/764 |
| 4,141,138 A | * | 2/1979 | Quick .......................... | 29/740 |
| 4,169,642 A | * | 10/1979 | Mouissie ..................... | 439/66 |
| 4,223,370 A | * | 9/1980 | Quere et al. ................. | 361/819 |
| 4,392,301 A | * | 7/1983 | Hannes et al. ................ | 29/741 |
| 4,420,207 A | * | 12/1983 | Nishikawa ................... | 439/368 |
| 4,601,525 A | * | 7/1986 | Kandybowski ............. | 439/329 |
| 4,679,319 A | * | 7/1987 | Grabbe et al. ................ | 29/843 |
| 4,679,871 A | * | 7/1987 | Egawa ......................... | 439/70 |
| 4,934,944 A | * | 6/1990 | Kozel et al. .................. | 439/68 |
| 5,288,266 A | * | 2/1994 | Halley ......................... | 454/182 |
| 5,458,498 A | * | 10/1995 | Ii et al. ........................ | 439/72 |
| 5,566,445 A | * | 10/1996 | Piao ............................. | 29/741 |
| 5,611,698 A | * | 3/1997 | Ito ............................... | 439/72 |
| 5,975,915 A | * | 11/1999 | Yamazaki et al. ............ | 439/72 |

FOREIGN PATENT DOCUMENTS

TW             444960         7/2001

* cited by examiner

*Primary Examiner*—Alex Gilman
(74) *Attorney, Agent, or Firm*—Wei Te Chung

(57) ABSTRACT

A tool (3) comprises a substantially rectangular base (30) defining a pair of chambers (36) in two adjacent sides thereof, and a pair of actuation member (31) deposed in the chamber respectively. Each actuation member comprises a bridging portion (34) spanning across the chamber and connecting with the base, a vertical driving portion (33) perpendicularly crossing the bridging portion, a connecting portion (35) connecting a junction of the bridging portion and driving portion with a bottom of the base, and an operating portion (32) adjoining an outside of the driving portion. The operating portion comprises a beam (320) extending perpendicurlarly from a bottom of the driving portion, and a push button (321) formed at a free end of the beam and protruding out from the base. The push button is pushable to pivot an upper section of the driving portion.

20 Claims, 5 Drawing Sheets

TOOL FOR ATTACHING INTEGRATED CIRCUIT PACKAGE TO ELECTRICAL CONNECTOR

BACKGROUND OF THE INVENTION

1. Field of the Invention

The present invention relates to a tool receiving an electrical connector thereon for assisting in attaching an integrated circuit package such as a land grid array (LGA) central processing unit (CPU) onto the connector with zero insertion force, thereby electrically connecting the CPU with a circuit substrate such as a printed circuit board (PCB). This application relates to a contemporaneously filed application having he same title, the same applicant and the same assignee with the instant application.

2. Description of the Prior Art

Referring to FIG. 5, a conventional electrical connector 9 is used for electrically connecting an integrated circuit package such as a land grid array (LGA) central processing unit (CPU) 8 with a circuit substrate such as a printed circuit board (PCB) (not shown). The connector 9 comprises a substantially rectangular insulative housing 91, and a plurality of electrical contacts 92 received in the housing 91. The housing 91 comprises a generally rectangular bottom wall 911, and four raised sidewalls 912 extending perpendicularly from a periphery of the bottom wall 911. A multiplicity of passageways 914 is defined in the bottom wall 911, the passageways 914 receiving a corresponding number of the contacts 92 therein. The sidewalls 912 define a generally rectangular cavity 913 therebetween, the cavity 913 receiving the CPU 8 therein. A spring arm 915 is formed in each of two adjacent sidewalls 912. A beveled block 9150 is formed at a free end of the spring arm 915, the block 9150 protruding into the cavity 913. A beveled surface 9151 is formed at an upper portion of the block 9150.

In attaching the CPU 8 onto the connector 9, the CPU 8 is firstly disposed on the beveled surfaces 9151 of the spring arms 915 of the housing 91. The CPU 8 is pressed downwardly, with two adjacent sidewalls of the CPU against the beveled surfaces 9151. The spring arms 915 elastically bend toward the corresponding sidewalls 912 of the connector 9, due to compression from the CPU 8. When a periphery of each of the blocks 9150 resiliently abuts against a corresponding sidewall of the CPU 8, a multiplicity of metal contact pads (not shown) of the CPU 8 electrically contacts the corresponding contacts 92 of the connector 9 respectively. The connector 9 electrically connects with the PCB, thereby electrically connecting the PCB with the CPU 8.

The CPU 8 is typically made of porcelain, and the housing 91 is typically made of insulative material such as plastic. During above-mentioned operation, the CPU 8 is liable to scrape the blocks 9150 of the connector 9. Some crumbs scraped from the blocks 9150 are liable to stick on a bottom of the CPU 8, and locate between the contact pads of the CPU 8 and the contacts 92 of the connector 9. This easily leads to disruption of the electrical connection between the CPU 8 and the PCB.

Additionally, when the spring arms 915 are relatively thin, portions of the spring arms 915 adjoining to the corresponding sidewalls 912 are liable to be broken during above-mentioned operation. When the spring arms 915 are relatively thick, the spring arms 915 is unlikely to be elastically bended due to less elasticity. Thus, the CPU 8 cannot electrically contact the contacts 92 of the connector 9.

In view of the above, a tool receiving the connector 9 thereon to assist the connector 9 in overcoming the above-mentioned disadvantages is desired.

SUMMARY OF THE INVENTION

Accordingly, an object of the present invention is to provide a tool, which receives an electrical connector thereon for assisting in reliably readily attaching an integrated circuit package such as a land grid array (LGA) central processing unit (CPU) onto the connector with zero insertion force, thereby electrically connecting the CPU with a circuit substrate such as a printed circuit board (PCB).

To achieve the above-mentioned objects, a tool in accordance with a preferred embodiment of the present invention comprises a substantially rectangular base, and a pair of actuation members formed at two adjacent sides of the base. The base defines a substantially rectangular opening in a middle thereof, and a pair of chambers in the two adjacent sides thereof. The actuation members are disposed in the chambers of the base respectively. Each actuation member comprises a bridging portion spanning across the chamber and connecting with the base, a vertical driving portion perpendicularly crossing the bridging portion, a connecting portion connecting a junction of the bridging portion and driving portion with a bottom of the base, and an operating portion adjoining an outside of the driving portion. The operating portion comprises a beam extending perpendicularly from a bottom of the driving portion, and a push button formed at a free end of the beam and protruding out from the base. The push button is pushable to pivot an upper section of the driving portion.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
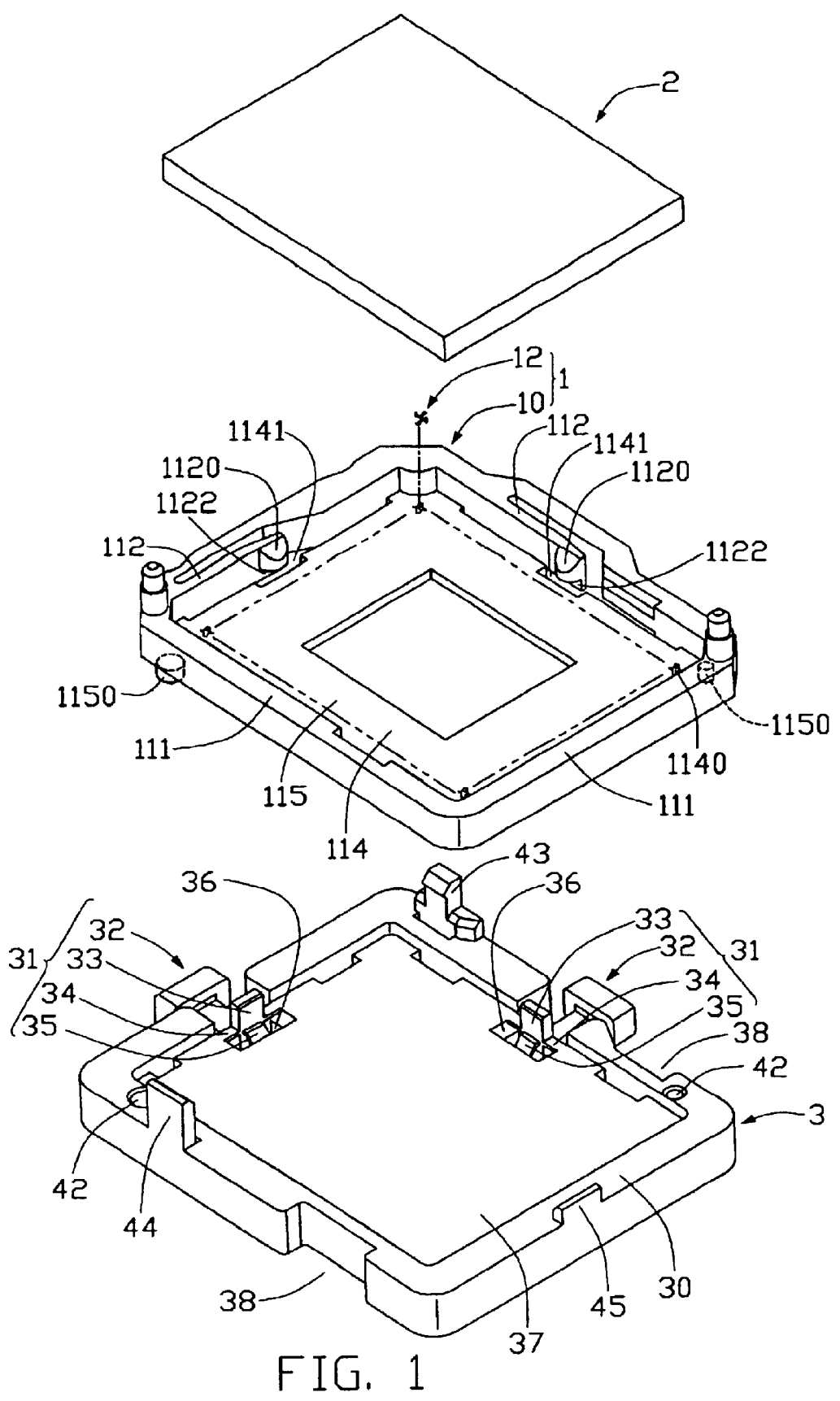
FIG. 1 is an exploded, isometric view of a tool in accordance with the preferred embodiment of the present invention, together with a CPU and an exploded electrical connector.

Referring to FIG. 1, a tool 3 of the present invention is mounted on a bottom of an electrical connector 1 for assisting in attaching an integrated circuit package such as a land grid array (LGA) central processing unit (CPU) 2 to the connector 1 with zero insertion force. The connector 1 provides electrical connection between the CPU 2 and a circuit substrate such as a printed circuit board (PCB) (not shown).

The connector 1 comprises a substantially rectangular insulative housing 10, and a plurality of electrical contacts 12 receiving in the housing 10. The housing 10 comprises a generally rectangular bottom wall 114, and four raised sidewalls 111 extending perpendicularly from a periphery of the bottom wall 114. A multiplicity of passageways 1140 is defined in the bottom wall 114, the passageways 1140 receiving a corresponding number of the contacts 12 therein. A pair of protrusions 1150 depends from two diagonally opposite corners of the bottom wall 114 respectively. The sidewalls 111 define a generally rectangular cavity 115 therebetween, the cavity 115 receiving the CPU 2 therein. A spring arm 112 is formed in each of two adjacent sidewalls 111. Each spring arm 112 is relatively thick compared with an overall thickness of its sidewall 111, and forms a beveled block 1120 at a free end thereof. An engaging surface 1122 is defined on the free end of the spring arm 112 under the block 1120. The block 1 120 protrudes into the cavity 115. An elongate slot 1141 is defined in the bottom wall 114 below each spring arm 112. Each contact 12 comprises an engaging portion securely received in a corresponding passageway 1140, a first contact portion protruding out from a top of the housing 10 for electrically contacting the CPU 2, and a second contact portion protruding out from a bottom of the housing 10 for electrically contacting the PCB.

Figure 2:
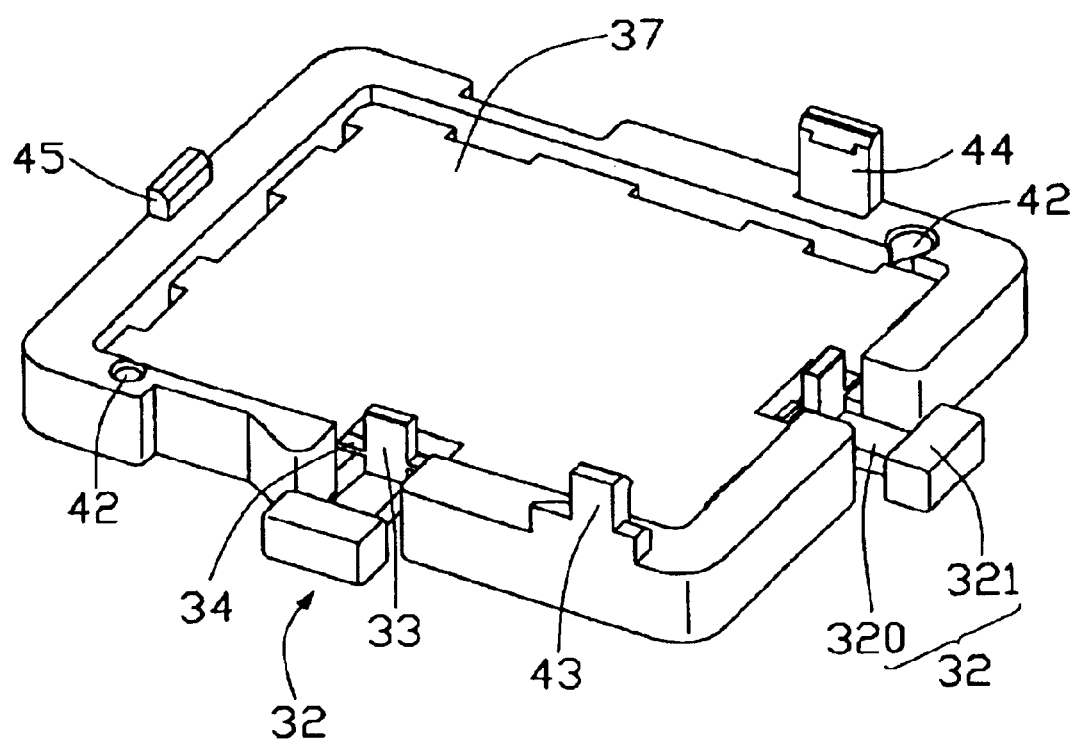
FIG. 2 is an isometric view of the tool of FIG. 1, but showing the tool from another viewing aspect.

Also referring to FIG. 2, the tool 3 is substantially rectangular, and larger than the housing 10 of the connector 1. The tool 3 comprises a substantially rectangular insulative base 30, and a pair of actuation members 31 at two adjacent sides of the base 30 respectively. A generally rectangular opening 37 is defined in a middle of the base 30, for receiving the second contact portions of the contacts 12. A pair of holes 42 is defined in two diagonally opposite corners of the base 30, corresponding to the protrusions 1150 of the connector 1. A pair of clasps 43, 44 is formed at the two opposite sides of the base 30 respectively, and a projecting member 45 is formed at another side of the base 30 between said two opposite sides. A pair of chambers 36 is defined in the two adjacent sides of the base 30, corresponding to the blocks 1120 of the connector 1 respectively. A pair of recesses 38 is defined in the two opposite sides of the base 30, for facilitating detachment of the connector 1 from the tool 3.

The actuation members 31 are disposed in the chambers 36 of the base 30 respectively. Each actuation member 31 comprises a bridging portion 34 spanning across the chamber 36 and connecting with the base 30, a vertical driving portion 33 perpendicularly crossing the bridging portion 34, a connecting portion 35 connecting a junction of the bridging portion 34 and driving portion 33 with a bottom of the base 30, and an operating portion 32 adjoining an outside of the driving portion 33. The operating portion 32 comprises a beam 320 extending perpendicularly from a bottom of the driving portion 33, and a push button 321 formed at a free end of the beam 320 and protruding out from the base 30.

Figure 3:
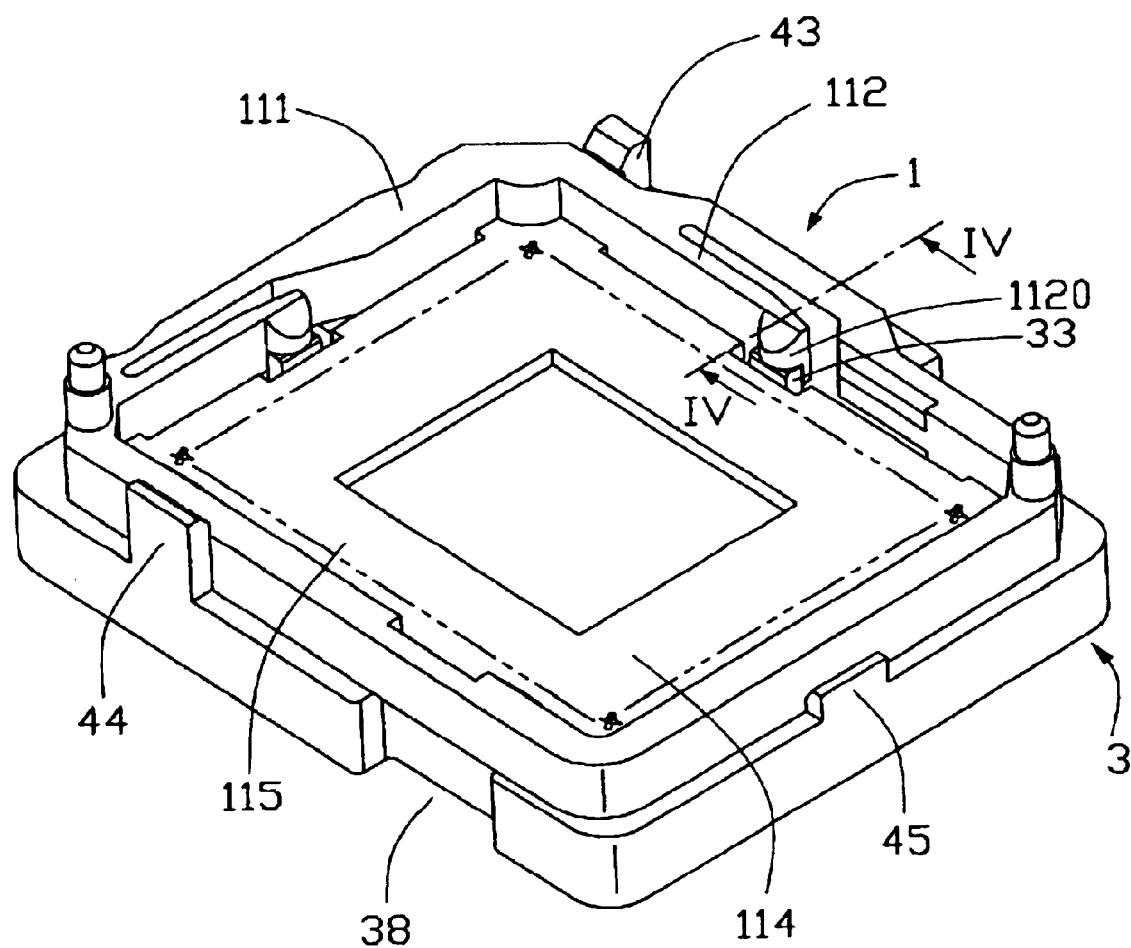
FIG. 3 is an enlarged, assembled view of the tool and the connector of FIG. 1.

Referring to FIG. 3, in assembly of the connector 1 and the tool 3, the connector 1 is disposed over the tool 3, with the protrusions 1150 of the connector 1 above the corresponding holes 42 of the tool 3, and three of the sidewalls 111 of the connector 1 respectively contacting the projecting member 45 and the clasps 43, 44. The connector 1 is pressed down, and the protrusions 1150 of the connector 1 are received in the corresponding holes 42. The projecting member 45 of the tool 3 interferentially engages with a corresponding sidewall 111 of the connector 1. The clasps 44, 45 engage against corresponding sidewalls 111 of the connector 1. Upper sections of the driving portions 33 of the tool 3 pass through the slots 1141 of the connector 1 and loosely abut the engaging surfaces 1122 of the spring arms 112.

Figure 4:
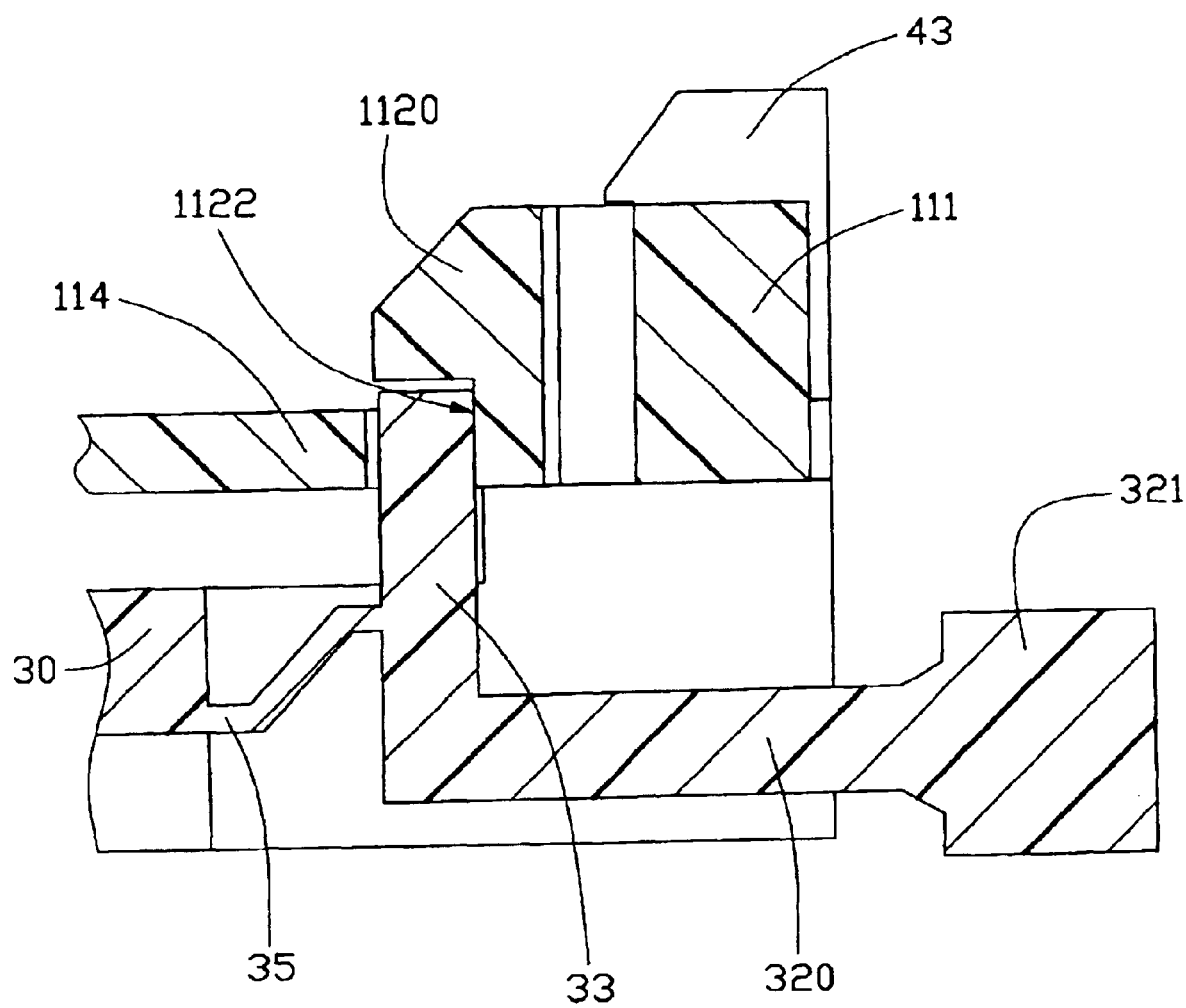
FIG. 4 is an enlarged, cross-sectional view taken along IV—IV line of FIG. 3.
Figure 5:
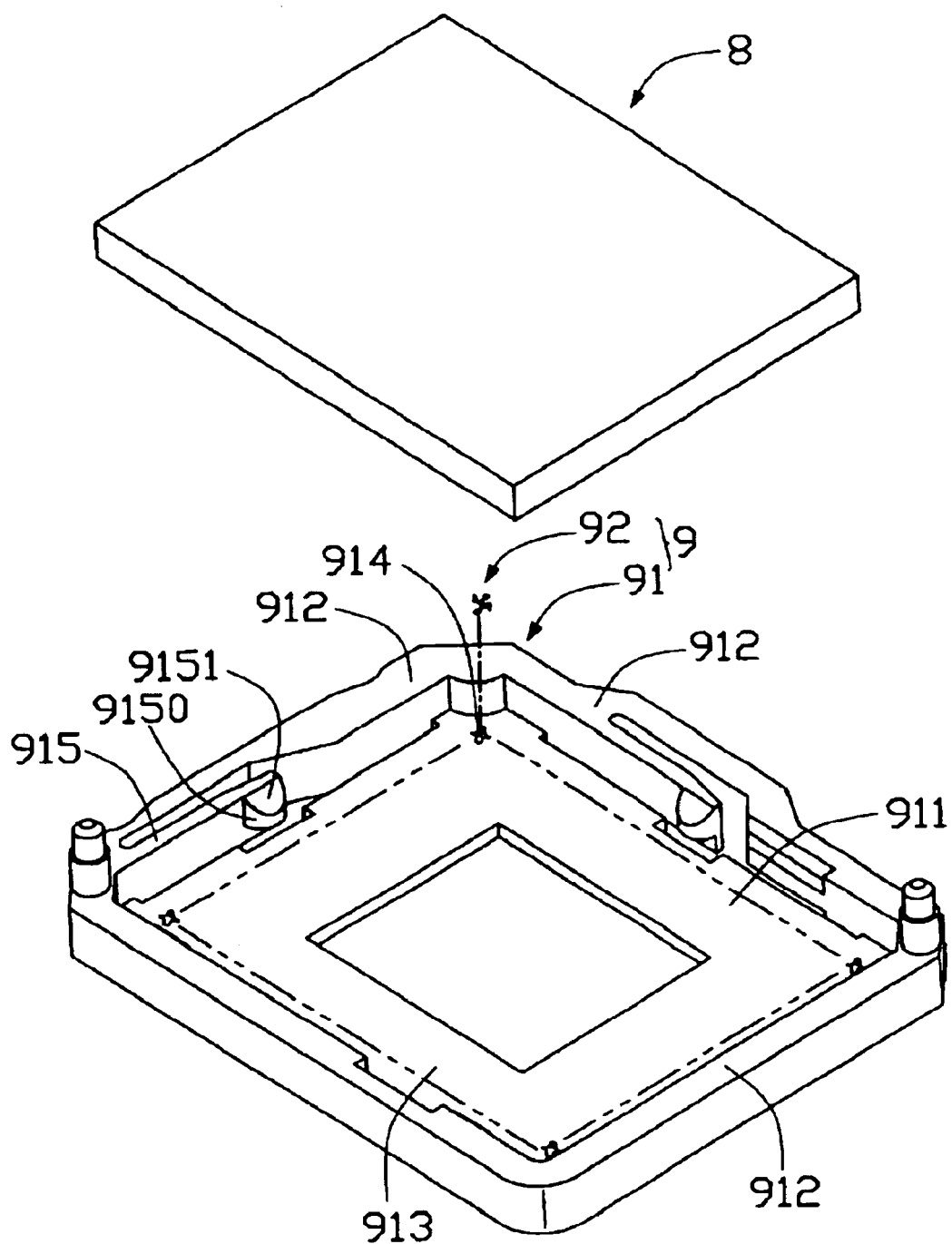
FIG. 5 is an exploded, isometric view of a conventional electrical connector, together with a CPU.

Also referring to FIG. 4, in attaching the CPU 2 onto the connector 1, the push buttons 321 of the actuation members 31 are pushed toward the corresponding chambers 36 of the base 30. The beams 320 push the bottoms of the corresponding driving portions 33. The driving portions 33 pivot about the junctions of the bridging portions 34 and connecting portions 35. The upper sections of the driving portions 33 push the engaging surfaces 1122 so that the spring arms 112 elastically bend toward the corresponding sidewalls 111 of the connector 1. The blocks 1120 of the spring arms 112 withdraw toward the sidewalls 111, even though the spring arms 112 are relatively thick. Moreover, the thick spring arms 112 inherently resist breakage. The CPU 2 is then placed into the cavity 115 of the connector 1 with zero insertion force. That is, the CPU 2 does not scrape the blocks 1120. The actuation members 31 are then released, and the spring arms 112 elastically rebound to their original positions to press against adjacent outside walls of the CPU 2. Thus, the CPU 2 is safely retained in the connector 1.

Then the combined connector 1 and CPU 2 is detached from the tool 3, and the connector 1 is electrically connected with the PCB. The connector 1 can thus provide reliable electrical connection between the CPU 2 and the PCB. Alternately, if sufficient space is provided on the printed circuit board on which the connector 1 is mounted, the actuation member 31 may be directly associated with or attached to the insulative housing 10 of the connector 1 around the spring arm 112 rather than the external tool 3, thus the external tool 3 no longer being used. Such an alternation may be of a lever arrangement like the current embodiment of the actuation member 31 or a cantilever arrangement like the upper handle of the spring latch used in the SIMM (Single In-line Memory Module) connector, e.g., U.S. Pat. No. 5,267,872. Anyhow, either the external actuation member of an auxiliary tool used for the connector or the self-equipped actuation member integrally formed with the connector, is designedly used to outwardly deflect the corresponding spring arm 112 for installation of the CPU into the housing 10.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. A tool for facilitating attachment of an integrated circuit package to an electrical connector having a housing with spring arms, the tool comprising:
   a base defining a chamber in one side thereof;
   an actuation member provided in the chamber, the actuation member comprising a driving portion and an operating portion extending perpendicularly from the driving portion, a middle portion of the driving portion connecting with the base thereby defining a lower section and an upper section thereat, the operating portion extending from the lower section of the driving portion and protruding out from the base, the operating portion being pushable to pivot the upper section of the driving portion so that respective spring arm being bended by the driving portion.

2. The tool as claimed in claim 1, wherein the base defines a pair of holes opposite sides thereof.

3. The tool as claimed in claim 1, wherein the base defines a pair of recesses in opposite sides thereof.

4. The tool as claimed in claim 1, wherein the base defines an opening in a middle thereof.

5. The tool as claimed in claim 1, wherein the base further comprises a pair of clasps at opposite sides thereof.

6. The tool as claimed in claim 5, wherein a projection member is provided at another side of the base.

7. The tool as claimed in claim 1, wherein a bridging portion spans across the chamber and connects with the base, the bridging portion perpendicularly crossing the driving portion.

8. The tool as claimed in claim 7, wherein a connecting portion connects a junction of the bridging portion and driving portion with a bottom of the base.

9. An electrical connector assembly comprising:
   an electrical connector comprising:
      an insulative housing comprising a bottom wall and four raised sidewalls extending from a periphery of the bottom wall, a spring arm formed in one of the sidewalls, the spring arm having an engaging surface at a free end thereof, an elongate slot being defined in the bottom wall below the spring arm; and
      a plurality of electrical contacts received in the housing; and
   a substantially rectangular tool receiving the housing thereon, one side of the tool defining a chamber, an actuation member being disposed in the chamber, the actuation member comprising a driving portion and an operating portion extending from a lower section of the driving portion and protruding out from the tool, a middle section of the driving portion connecting with the tool, an upper section of the driving portion being received through the slot of the connector and abutting the engaging surface, the operating portion being pushable to drive the spring arm, wherein the spring arm elastically bends toward said one of the sidewalls of the connector.

10. The electrical connector assembly as claimed in claim 9, wherein opposite sides of the toot define a pair of holes, the holes receiving protrusions of the connector therein.

11. The electrical connector assembly as claimed in claim 9, wherein the tool defines a pair of recesses in opposite sides thereof, for facilitating detachment of the connector from the tool.

12. The electrical connector assembly as claimed in claim 9, wherein a middle portion of the tool defines an opening, the opening receiving portions of contacts protruding out from a bottom of the connector.

13. The electrical connector assembly as claimed in claim 9, wherein a pair of clasps is formed at opposite sides of the tool, the clasps engaging against corresponding sidewalls of the connector.

14. The electrical connector assembly as claimed in claim 13, wherein a projection member is formed at another side of the tool, the projection member interferentially engaging with another corresponding sidewall of the connector.

15. The electrical connector assembly as claimed in claim 9, wherein a bridging portion spans across the chamber and connects with the tool, the bridging portion perpendicularly crossing the driving portion.

16. The electrical connector assembly as claimed in claim 15, wherein a connecting portion connects a junction of the bridging portion and driving portion with a bottom of the tool.

17. An electrical connector assembly comprising:
   an electrical connector including:
      an insulative housing defining a bottom wall and circumferential side walls extending therefrom, a horizontal spring arm disposed around one of said side walls;
      a receiving cavity defined among said base wall and said side walls;
      a plurality of contacts disposed in the base wall with contact portions extending into the receiving cavity; and
      an actuation member defining a lever type structure thereof and including an operation portion easily accessible from an exterior and a driving portion opposite to said operation portion under a lever effect; wherein
   when said operation portion is moved in a first direction, said driving portion is moved to a second direction different from said first direction, and said driving portion actuates said spring arm to move outwardly.

18. The assembly as claimed in claim 17, wherein said actuation member is formed on an external tool which is attached to the housing for helping installation of an electronic package into the housing.

19. The assembly as claimed in claim 17, wherein said second direction is an outward direction along which said spring arm is deflected.

20. The assembly as claimed in claim 19, wherein said first direction and said second direction is opposite to each other.

* * * * *